(12) United States Patent
Miyazawa

(10) Patent No.: US 9,331,640 B2
(45) Date of Patent: May 3, 2016

(54) AMPLIFIER

(71) Applicant: Sumitomo Electric Device Innovations, Inc., Yokohama-shi (JP)

(72) Inventor: Naoyuki Miyazawa, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/604,029

(22) Filed: Jan. 23, 2015

(65) Prior Publication Data

US 2015/0214905 A1 Jul. 30, 2015

(30) Foreign Application Priority Data

Jan. 24, 2014 (JP) .................................. 2014-011764

(51) Int. Cl.
*H03F 3/195* (2006.01)
*H03F 1/56* (2006.01)
(Continued)

(52) U.S. Cl.
CPC ............ *H03F 1/56* (2013.01); *H01L 23/49562* (2013.01); *H01L 23/49575* (2013.01); *H01L 23/49838* (2013.01); *H01L 24/49* (2013.01); *H01L 24/73* (2013.01); *H03F 3/195* (2013.01); *H01L 23/3121* (2013.01); *H01L 24/06* (2013.01); *H01L 24/29* (2013.01); *H01L 24/32* (2013.01); *H01L 24/48* (2013.01); *H01L 2224/04042* (2013.01); *H01L 2224/0557* (2013.01); *H01L 2224/05554* (2013.01); *H01L 2224/0603* (2013.01); *H01L 2224/06135* (2013.01); *H01L 2224/29294* (2013.01); *H01L 2224/29339* (2013.01); *H01L 2224/32245* (2013.01); *H01L 2224/451* (2013.01); *H01L 2224/48091* (2013.01); *H01L 2224/48137* (2013.01); *H01L 2224/48195* (2013.01); *H01L 2224/48247* (2013.01); *H01L 2224/49113* (2013.01); *H01L 2224/49175* (2013.01); *H01L 2224/73265* (2013.01); *H01L 2924/00014* (2013.01); *H01L 2924/1033* (2013.01); *H01L 2924/10329* (2013.01); *H01L 2924/1306* (2013.01);
(Continued)

(58) Field of Classification Search
CPC ................................ H03F 3/187; H03F 3/195
USPC .................................................. 330/307, 295
See application file for complete search history.

(56) References Cited

U.S. PATENT DOCUMENTS 7,564,303 B2 * 7/2009 Perugupalli et al. ............ 330/66
8,598,954 B2 * 12/2013 Deguchi et al. ............... 330/295
(Continued)

FOREIGN PATENT DOCUMENTS

JP 2000-0779540 A 3/2000

*Primary Examiner* — Henry Choe
(74) *Attorney, Agent, or Firm* — Venable LLP; Michael A. Sartori

(57) ABSTRACT

An amplifier includes: a package which includes a pair of edge portions; an input terminal which is provided in the edge portion; output terminals which are provided in the edge portion; a first-stage FET chip which includes an input port directly connected to the input terminal by a bonding wire; a first-stage terminal which is provided in the edge portion and is directly connected to an output port of the first-stage FET chip by a bonding wire; a second-stage terminal which is provided in the edge portion; a second-stage FET chip which includes an output port directly connected to output terminals and by a bonding wire; and an impedance matching capacitor element of which one electrode is connected to the second-stage terminal and the input port of the second-stage FET chip.

13 Claims, 7 Drawing Sheets

(51) Int. Cl.
*H01L 23/495* (2006.01)
*H01L 23/498* (2006.01)
*H01L 23/31* (2006.01)
*H01L 23/00* (2006.01)
*H05K 3/28* (2006.01)

(52) U.S. Cl.
CPC . *H01L2924/13064* (2013.01); *H01L 2924/181* (2013.01); *H01L 2924/19041* (2013.01); *H01L 2924/19105* (2013.01); *H01L 2924/3011* (2013.01); *H01L 2924/30107* (2013.01); *H01L 2924/30111* (2013.01); *H03F 2200/222* (2013.01); *H03F 2200/318* (2013.01); *H03F 2200/387* (2013.01); *H03F 2200/391* (2013.01); *H03F 2200/411* (2013.01); *H05K 3/284* (2013.01); *H05K 2203/049* (2013.01)

(56) References Cited

U.S. PATENT DOCUMENTS

| | | | | |
|---|---|---|---|---|
| 8,829,999 | B2 * | 9/2014 | Fisher | 330/307 |
| 2005/0270083 | A1 * | 12/2005 | Nakatsuka et al. | 327/430 |
| 2015/0035066 | A1 * | 2/2015 | Otsuka et al. | 257/368 |

* cited by examiner

AMPLIFIER

BACKGROUND OF THE INVENTION

1. Field of the Invention

The present application relates to an amplifier.

2. Background Arts

In order to amplify power with a high gain and a high output, there is known an amplifier including a plurality of amplifying devices connected in series to each other. A Japanese Patent Application laid open No. 2000-77954A(JP 2000-77954A) discloses such an amplifier. In the amplifier, the plurality of amplifying devices connected in series to each other are integrated in one semiconductor chip. Further, the amplifier further includes three matching circuits. A first matching circuit is connected between an input terminal and an input port of a first-stage amplifying device. A second matching circuit is connected between an output port of the first-stage amplifying device and an input port of a second-stage amplifying device. A third matching circuit is connected between the output terminal and an output port of the second-stage amplifying device. Three matching circuits and one semiconductor chip are mounted on a common dielectric substrate.

SUMMARY OF THE INVENTION

As described above, three matching circuits are provided in the amplifier disclosed in JP 2000-77954A. However, when the plurality of matching circuits are provided in this way, the component cost or the number of mounting steps increases. The present application is made to solve such problems, and an object of the present application is to provide an amplifier capable of suppressing an increase in component cost or an increase in number of mounting, steps by decreasing the number of matching circuits.

In order to solve the above-described problems, an amplifier of the present application includes: a package which includes a first edge and a second edge, the first edge and the second edge are arranged in parallel to both sides of the package; an input terminal which is provided in the first edge; an output terminal which is provided in the second edge; a first-stage amplifier chip which is provided in the package and includes an input port connected to the input terminal by a first bonding wire; a first-stage terminal which is provided in the first edge and is connected to an output port of the first-stage amplifier chip by a second bonding wire; a second-stage terminal which is provided in the first edge; a second-stage amplifier chip which is provided in the package, includes an output port connected to the output terminal by a third bonding wire; and an capacitor element which is provided in the package and of which one electrode is connected to the second-stage terminal through a fourth bonding wire and is connected to an input port of the second-stage amplifier chip through a fifth bonding wire, wherein the distance between the first edge and the first-stage amplifier chip is shorter than the distance between the second edge and the first-stage amplifier chip, and wherein the distance between the second edge and the second-stage amplifier chip is shorter than the distance between the first edge and the second-stage amplifier chip.

DESCRIPTION OF EMBODIMENTS

Figure 1:
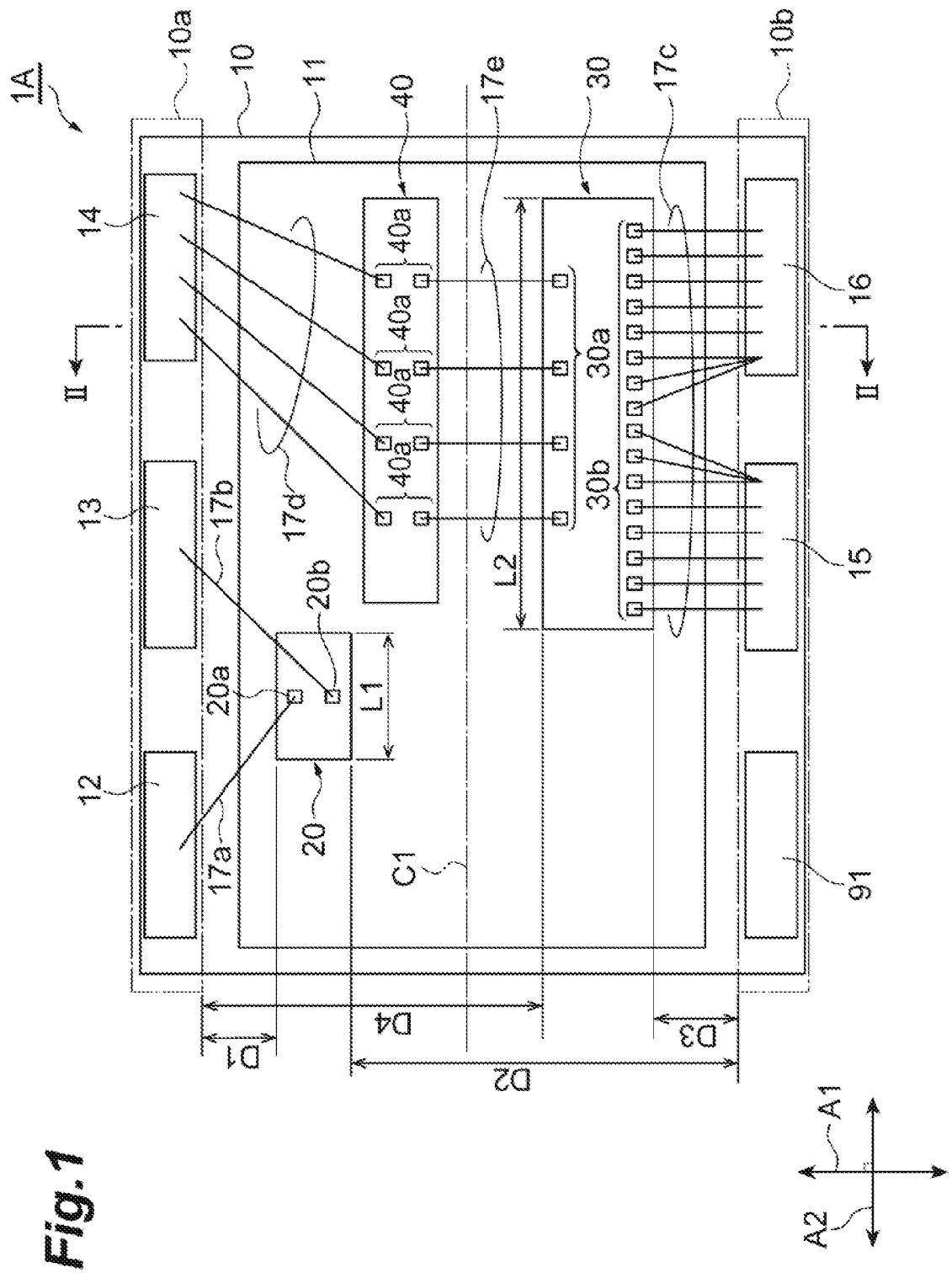
FIG. 1 is a top view illustrating the configuration of an amplifier according to an embodiment.

First, an embodiment of the invention will be described. (1) An amplifier of the present application includes: a package which includes a first edge and a second edge, the first edge and the second edge are arranged in parallel to both sides of the package; an input terminal which is provided in the first edge; an output terminal which is provided in the second edge; a first-stage amplifier chip which is provided in the package and includes an input port connected to the input terminal by a first bonding wire; a first-stage terminal which is provided in the first edge and is connected to an output port of the first-stage amplifier chip by a second bonding wire; a second-stage terminal which is provided in the first edge; a second-stage amplifier chip which is provided in the package, includes an output port connected to the output terminal by a third bonding wire; and an capacitor element which is provided in the package and of which one electrode is connected to the second-stage terminal through a fourth bonding wire and is connected to an input port of the second-stage amplifier chip through a fifth bonding wire, wherein the distance between the first edge and the first-stage amplifier chip is shorter than the distance between the second edge and the first-stage amplifier chip, and wherein the distance between the second edge and the second-stage amplifier chip is shorter than the distance between the first edge and the second-stage amplifier chip.

In the amplifier, the first-stage amplifier chip is disposed near one edge portion, and the second-stage amplifier chip is disposed near the other edge portion. Accordingly, since the first bonding wire connecting the input terminal to the first-stage amplifier chip and the third bonding wire connecting the output terminal to the second-stage amplifier chip may be shortened compared to the related art, the inductance of the first bonding wire and the third bonding wire may be decreased. Further, in general, the impedance of each of the input terminal and the output terminal of the first-stage amplifier chip is enough for the external impedance. Further, the impedance of the output terminal of the second-stage amplifier chip is comparatively larger than that of the input terminal. Thus, according to the amplifier, the matching circuit between the input terminal and the first-stage amplifier chip and the matching circuit between the output terminal and the second-stage amplifier chip may be removed, and hence the component cost or the number of mounting steps may be suppressed.

(2) Further, in the amplifier, the sum of the length of the fourth bonding wire and the length of the fifth bonding wire may be longer than the length of the third bonding wire.

(3) Further, in the amplifier, the impedance of the input terminal of the first-stage amplifier chip may be larger than the impedance of the input terminal of the second-stage amplifier chip, and the impedance of the output terminal of the first-stage amplifier chip may be larger than the impedance of the output terminal of the second-stage amplifier chip.

(4) Further, in the amplifier, the width of the output terminal in the direction following the pair of edge portions may be larger than the width of each of the input terminal, the first-stage terminal, and the second-stage terminal in the direction. In general, the output power from the second-stage amplifier chip is remarkably larger than the input power and the output power of the first-stage amplifier chip. Thus, when the width of the output terminal is larger than the width of each of different terminals, the resistance value of the output terminal decreases, and hence large power may be output with high efficiency.

(5) Further, the amplifier may further include a third terminal which is provided in the first edge and is located between the input terminal and first-stage terminal, wherein the third terminal may be connected to a ground potential. Accordingly, the isolation degree between the terminals in one edge portion may be improved.

(6) Further, in the amplifier, the first-stage terminal and the second-stage terminal may be connected to each other at the outside of the package.

(7) Further, in the amplifier, the chip size of the second-stage FET chip may be larger than that of the first-stage FET chip. Accordingly, the second-stage FET chip may appropriately generate output power larger than the output power from the first-stage FET chip.

(8) Further, in the amplifier, the package may be sealed by a resin.

(9) Further, in the amplifier, a matching circuit may not be provided between the input terminal and the first-stage FET chip and between the output terminal and the second-stage FET chip.

(10) Further, in the amplifier, the output power of the second-stage amplifier chip is larger than output power of the first-stage amplifier chip.

(11) Further, in the amplifier, a driving voltage of the first-stage amplifier chip is equal to a driving voltage of the second-stage amplifier chip.

(12) Further, in the amplifier, the first-stage amplifier chip and the second-stage amplifier chip are formed as discrete chips.

(13) Further, in the amplifier, the first-stage amplifier chip and the second-stage amplifier chip are composed of gallium nitride based material.

(14) An amplifier of the present application includes: A package having an input terminal, an output terminal, a first-stage terminal and a second-stage terminal, the input terminal, the first-stage terminal, and the second-stage terminal are provided at first edge of the package, the output terminal provided at second edge opposing to the first edge of the package; a first amplifier having an input and an output, the input of the first amplifier connected to the input terminal, the output of the first amplifier connected to the first-stage terminal and; a second amplifier having an input and an output, the input of the second amplifier connected to the second-stage terminal via an impedance matching element, the output of the second amplifier connected to the output terminal.

(15) Further, in the amplifier, the impedance matching element is capacitor element, and the impedance matching element connected parallel to ground potential and the input of the second-stage amplifier.

Specific examples of an amplifier according to the embodiment of the present application will be described below with reference to the drawings. Furthermore, the present invention is not limited to these examples, and all meanings equivalent to claims and all modifications within the scope are included in the invention. In the description below, the same reference numerals will be given to the same components in the description of the drawings, and the repetitive description thereof will not be presented.

FIG. 1 is a top view schematically illustrating the configuration of an amplifier 1A according to the embodiment. As illustrated in FIG. 1, the amplifier 1A includes a package 10, a die stage 11 of a lead frame, an input terminal 12, a first-stage terminal 13, a second-stage terminal 14, output terminals 15 and 16, a first-stage FET chip 20, a second-stage FET chip 30, and a capacitor element 40.

For example, the package 10 is formed of a resin material such as an epoxy resin by molding, and the first-stage FET chip 20, the second-stage FET chip 30, and the capacitor element 40 are embedded in the package 10. The package 10 has, for example, a rectangular plane shape, and includes a pair of edge portions 10a and 10b arranged in parallel in a first direction A1. The edge portions 10a and 10b extend in a second direction A2 intersecting the first direction A1. The die stage 11 is a metallic plate-shaped member. The die stage 11 is provided in the lower surface (the surface facing the interconnection substrate when the package is mounted on the interconnection substrate) of the package 10, and is exposed from the package 10. The first-stage FET chip 20, the second-stage FET chip 30, and the capacitor element 40 are mounted on the die stage 11.

The input terminal 12, the first-stage terminal 13, the second-stage terminal 14, and the output terminals 15 and 16 are metallic terminals, are provided in the lower surface of the package 10, and are exposed from the package 10. Among these components, the input terminal 12, the first-stage terminal 13, and the second-stage terminal 14 are provided in series in this order at one edge portion 10a of the package. Further, the output terminals 15 and 16 are provided in series at the other edge portion 10b of the package. An electric input signal is applied from the outside of the package 10 to the input terminal 12. The first-stage terminal 13 outputs an electric output signal from the first-stage FET chip 20 to be described later to the outside of the package 10. For example, the second-stage terminal 14 is electrically connected to the first-stage terminal 13 at the outside of the package 10, and inputs an electric signal output from the first-stage terminal 13. The output terminals 15 and 16 output an electric output signal from the second-stage FET chip 30 to be described later to the outside of the package 10. Furthermore, the other edge portion 10b is further provided with one terminal 91, the terminal 91 is an unused terminal. The unused terminal is a terminal which is not connected to the other terminal by a bonding wire inside the package 10.

For example, the first-stage FET chip 20 is a chip in which an FET called a high mobility transistor (HEMT) is embedded, and includes an input port 20a and an output port 20b. The first-stage FET chip 20 amplifies an electric signal input to the input port 20a, and outputs the amplified electric signal from the output port 20b. The input port 20a is, for example, a gate, and the output port 20b is, for example, a drain. In that case, a source is connected to the die stage 11. The die stage 11 is set to, for example, a reference potential (a ground potential).

The first-stage PET chip 20 is disposed in an area near one edge portion 10a inside the package 10. That is, the distance D1 between one edge portion 10a and the first-stage FET chip 20 is shorter than the distance D2 between the other edge portion 10b and the first-stage FET chip 20. More desirably, the first-stage FET chip 20 is disposed inside an area near the edge portion 10a with respect to a center line C1 of the package 10. The input port 20a is directly connected to the input terminal 12 by a bonding wire 17a (a first bonding wire). Further, the output port 20b is directly connected to the first-stage terminal 13 by a bonding wire 17b (a second bonding wire). Here, the direct connection means a state where the terminals are short-circuited to each other without using other chips including active or passive circuit components. Furthermore, it is desirable that the impedance of the input port 20a be equal to the impedance of the input terminal 12.

For example, the second-stage FET chip 30 is a chip in which an FET called an HEMT is embedded, and includes an input port 30a and an output port 30b. The second-stage FET chip 30 amplifies an electric signal input to the input port 30a, and outputs the amplified electric signal from the output port 30b. The input port 30a is, for example, a gate of the FET, the output port 30b is, for example, a drain of the FET. In that case, a source of the FET is connected to the die stage 11.

The second-stage FET chip 30 is disposed in an area near the other edge portion 10b inside the package 10. That is, the distance D3 between the other edge portion 10b and the second-stage FET chip 30 is shorter than the distance D4 between one edge portion 10a and the second-stage FET chip 30. More desirably, the second-stage FET chip 30 is disposed inside an area near the edge portion 10b with respect to the center line C1 of the package 10. The output port 30b is directly connected to the output terminals 15 and 16 by a bonding wire 17c (a third bonding wire). The second-stage FET chip 30 further amplifies the electric signal amplified by the first-stage FET chip 20. For that reason, the chip size L2 of the second-stage FET chip 30 is larger than the chip size L1 of the first-stage FET chip 20. Furthermore, it is desirable that the impedance of the input port 20a of the first-stage FET chip 20 be larger than the impedance of the input terminal 30a of the second-stage FET chip 30. Further, it is desirable that the impedance of the output port 20b of the first-stage FET chip 20 be larger than the impedance of the output port 30b of the second-stage FET chip 30.

The capacitor element 40 is an element in which an impedance matching capacitor is embedded, and includes a pair of electrodes. One electrode 40a of the capacitor element 40 is electrically connected to the second-stage terminal 14 through a bonding wire 17d (a fourth bonding wire). Further, one electrode 40a is directly connected to the input port 30a of the second-stage FET chip 30 through a bonding wire 17e (a fifth bonding wire). The other electrode of the capacitor element 40 is connected to the die stage 11. The sum of the length of the bonding wire 17d and the length of the bonding wire 17e is longer than the length of the bonding wire 17c.

Figure 2:
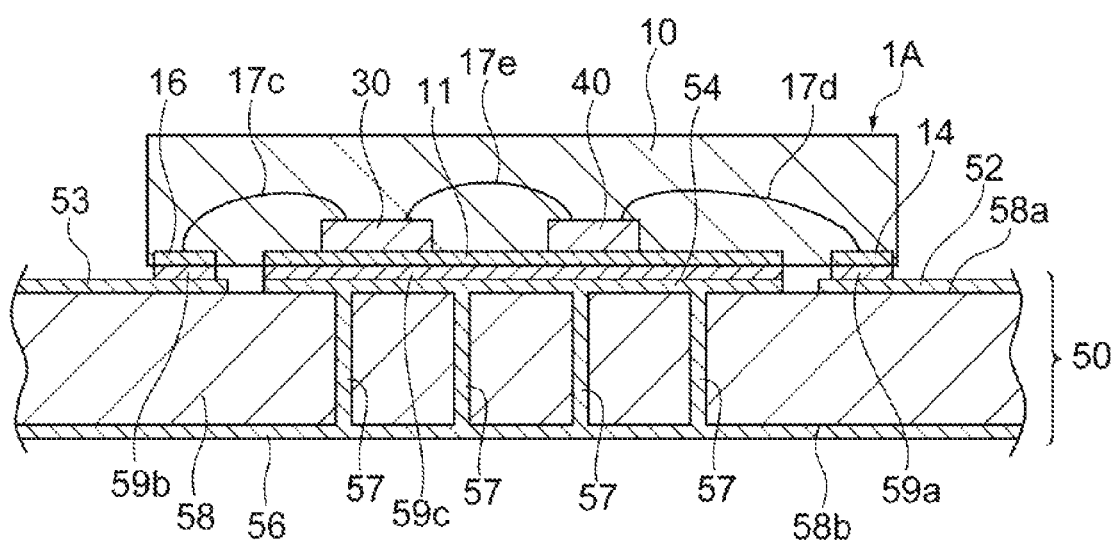
FIG. 2 is a side cross-sectional view illustrating a state where an amplifier is mounted on an interconnection substrate.
Figure 3:
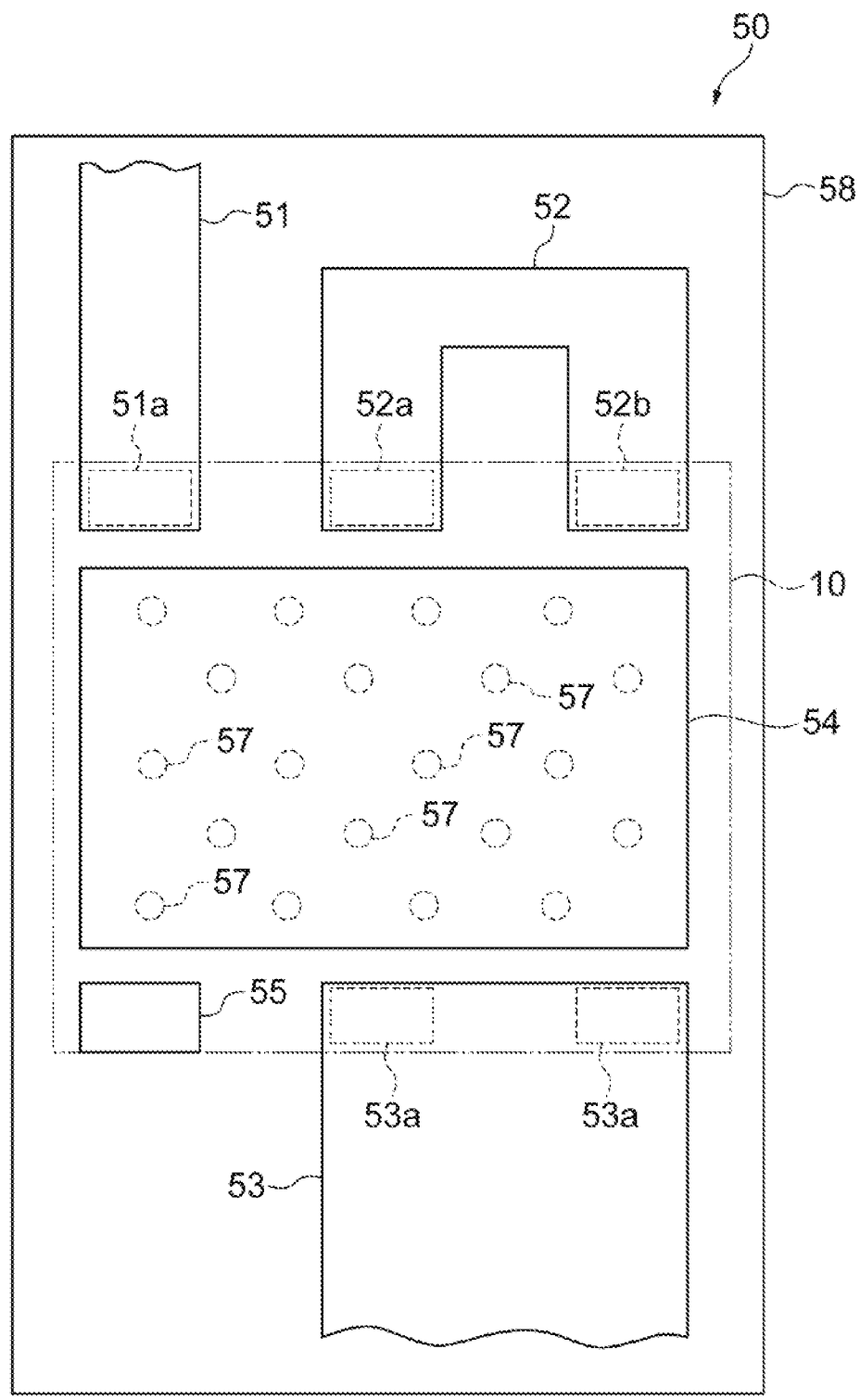
FIG. 3 is a top view illustrating an interconnection pattern of the interconnection substrate.

FIG. 2 is a side cross-sectional view illustrating a state where the amplifier 1A is mounted on the interconnection substrate 50. Further, FIG. 3 is a top view illustrating an interconnection pattern of the interconnection substrate 50. As illustrated in FIGS. 2 and 3, the interconnection substrate 50 includes a dielectric substrate 58, interconnection patterns 51 to 55, and a reference potential interconnection pattern 56. The dielectric substrate 58 includes a principal surface 58a and a rear surface 58b. The interconnection patterns 51 to 55 are provided on the principal surface 58a, and the reference potential interconnection pattern 56 is provided on the entire surface of the rear surface 58b. The input terminal 12 is bonded to one end portion 51a of the interconnection pattern 51 through a conductive adhesive (for example, silver paste). The first-stage terminal 13 and the second-stage terminal 14 are respectively bonded to one end portion 52a and the other end portion 52b of the interconnection pattern 52 through a conductive adhesive 59a. Accordingly, the first-stage terminal 13 and the second-stage terminal 14 are connected to each other at the outside of the package 10. The output terminals 15 and 16 are bonded to one end portion 53a of the interconnection pattern 53 through a conductive adhesive 59b. The interconnection pattern 54 is provided at a position facing the die stage 11, and is bonded to the die stage 11 through a conductive adhesive 59c. The interconnection pattern 54 is electrically connected to the reference potential interconnection pattern 56 through a plurality of through-vias 57 penetrating the principal surface 58a and the rear surface 58b. Furthermore, the unused terminal 91 is bonded to the interconnection pattern 55.

Figure 4A:
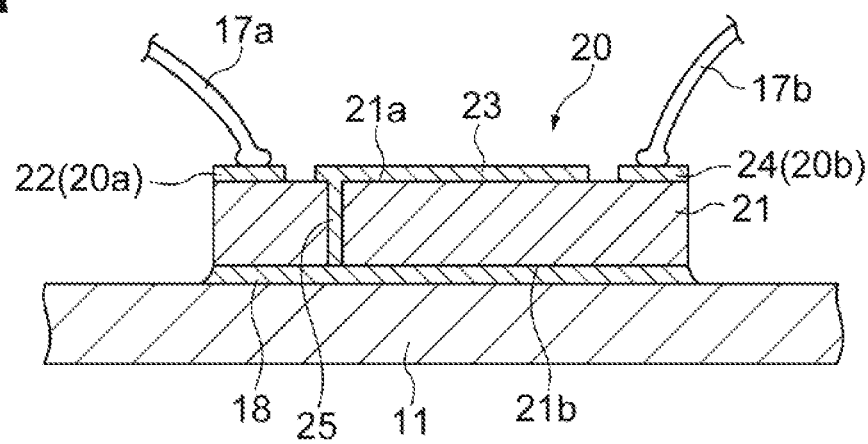
FIG. 4A is an enlarged cross-sectional view illustrating a first-stage FET chip.
Figure 4B:
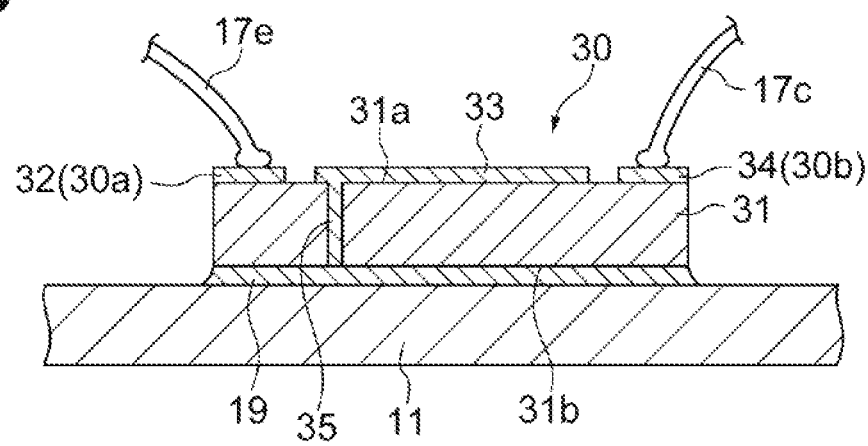
FIG. 4B is an enlarged cross-sectional view illustrating a second-stage FET chip.

FIGS. 4A and 4B are enlarged cross-sectional views illustrating the first-stage FET chip 20 and the second-stage FET chip 30. As illustrated in FIG. 4A, the first-stage FET chip 20 includes a semiconductor substrate (for example, a GaN substrate or a GaAs substrate) 21, a gate pad 22 which corresponds to the input port 20a, a source pad 23 and a drain pad 24 which corresponds to the output port 20b. The gate pad 22, the source pad 23 and the drain pad 24 are provided on the principal surface 21a of the semiconductor substrate 21. The rear surface 21b of the semiconductor substrate 21 is bonded to the die stage 11 through a conductive adhesive (for example, silver paste) 18. One ends of the bonding wires 17a and 17b are respectively boded to the gate pad 22 and the drain pad 24. The source pad 23 is electrically connected to the conductive adhesive 18 through a source via 25 which penetrates the semiconductor substrate 21 from the principal surface 21a to the rear surface 21b. Further, as illustrated in FIG. 4B, the second-stage FET chip 30 includes a semiconductor substrate (for example, a GaN substrate or a GaAs substrate) 31, a gate pad 32 which corresponds to the input port 30a, a source pad 33 and a drain pad 34 which corresponds to the output port 30b. The gate pad 32, the source pad 33 and the drain pad 34 are provided on the principal surface 31a of the semiconductor substrate 31. The rear surface 31b of the semiconductor substrate 31 is bonded to the die stage 11 through a conductive adhesive (for example, silver paste) 19. One ends of the bonding wires 17e and 17c are respectively bonded to the gate pad 32 and the drain pad 34. The source pad 33 is electrically connected to the conductive adhesive 19 through a source via 35 which penetrates the semiconductor substrate 31 from the principal surface 31a to the rear surface 31b.

Figure 5:
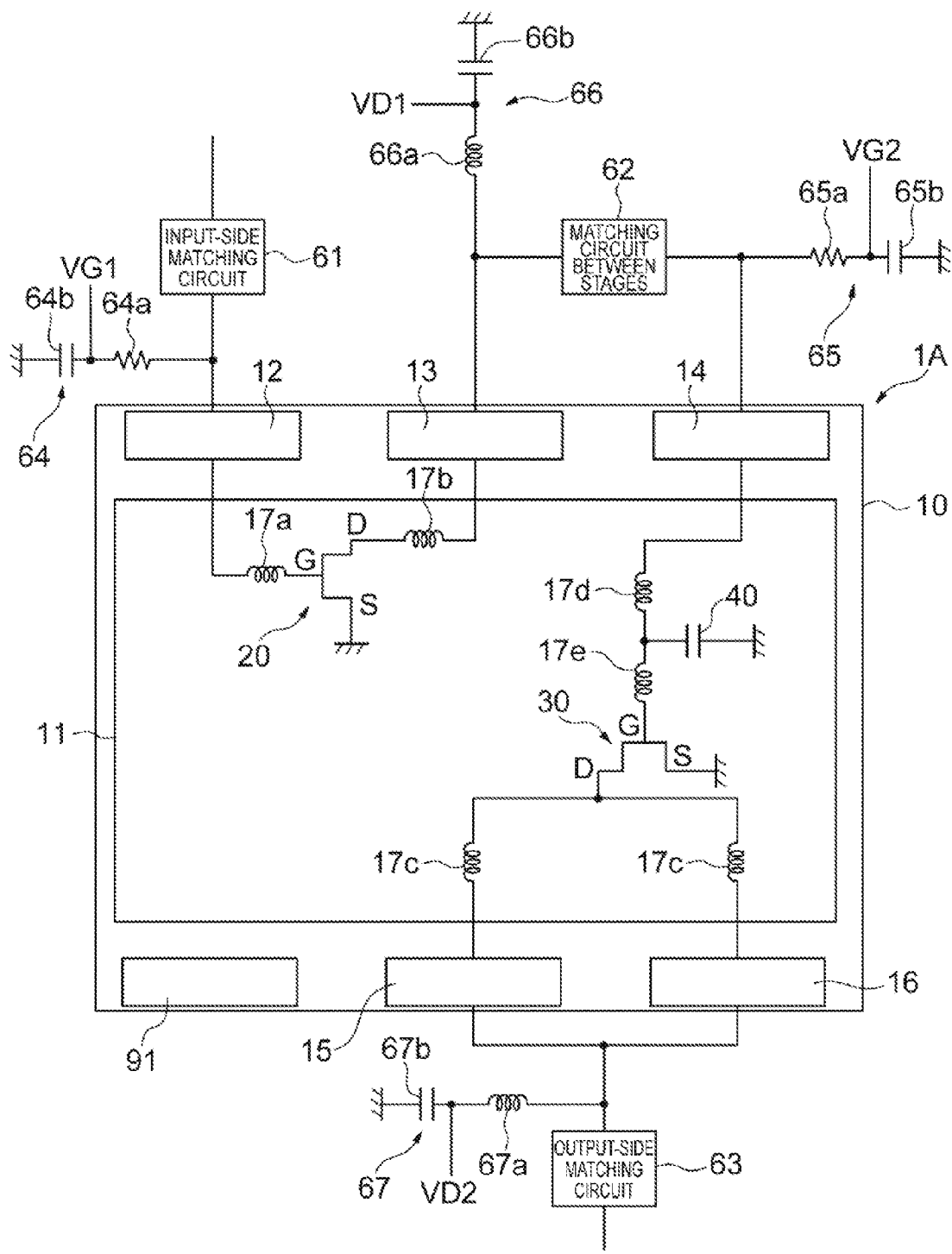
FIG. 5 is a circuit diagram illustrating an application of the amplifier.

FIG. 5 is a circuit diagram illustrating an application of the amplifier 1A according to the embodiment. As illustrated in FIG. 5, an input-side matching circuit 61 is connected to the input terminal 12, and an input signal is input to the input terminal 12 through the input-side matching circuit 61. Further, a matching circuit 62 is connected between the first-stage terminal 13 and the second-stage terminal 14, and a signal output from the first-stage terminal 13 is input to the second-stage terminal 14 through the matching circuit 62. Further, an output-side matching circuit 63 is connected to the output terminals 15 and 16, and an output signal is output to the outside of the package 10 through the output-side matching circuit 63.

As illustrated in FIG. 5, a gate bias circuit 64 may be connected to the input terminal 12. For example, the gate bias circuit 64 includes a resistance 64a and a capacitor 64b which are connected in series between the input terminal 12 and the ground potential line, and a gate bias voltage VG1 is input to a node between the resistance 64a and the capacitor 64b. Similarly, a gate bias circuit 65 may be connected to the second-stage terminal 14. For example, the gate bias circuit 65 includes a resistance 65a and a capacitor 65b which are connected in series between the second-stage terminal 14 and the ground potential line, and a gate bias voltage VG2 is input to a node between the resistance 65a and the capacitor 65b.

As illustrated in FIG. 5, a drain bias circuit 66 may be connected to the first-stage terminal 13. For example, the drain bias circuit 66 includes an inductor 66a and a capacitor 66b which are connected in series between the first-stage terminal 13 and the ground potential line, and a drain bias voltage VD1 is input to a node between the inductor 66a and the capacitor 66b. Similarly, a drain bias circuit 67 may be connected to the output terminals 15 and 16. For example, the drain bias circuit 67 includes an inductor 67a and a capacitor 67b which are connected in series between the output terminals 15 and 16 and the ground potential line, and a drain bias voltage VD2 is input to a node between the inductor 67a and the capacitor 67b.

The operation and the effect obtained by the amplifier 1A with the above-described configuration will be described. In the amplifier 1A, the first-stage PET chip 20 as the amplifying circuit of the front stage and the second-stage FET chip 30 as the amplifying circuit of the rear stage are formed as different chips. Further, the input terminal 12 which is connected to the input port 20a of the first-stage FET chip 20 and the first-stage terminal 13 which is connected to the output port 20b of the first-stage FET chip 20 are disposed at the same side (the edge portion 10a) of the package 10. Then, the first-stage FET chip 20 is disposed near one edge portion 10a of the package 10. With such a configuration, the inductance may be decreased by shortening the bonding wire 17a connecting the input terminal 12 to the first-stage FET chip 20 and the bonding wire 17b connecting the first-stage terminal 13 to the first-stage FET chip 20 compared to the related art. Here, since the maximum output required for the first-stage FET chip 20 is smaller than that of the second-stage FET chip 30 (the number of the fingers of the first-stage FET chip 20 may be small), the gate electrode (that is, the input port 20a) and the drain electrode (that is, the output port 20b) of the first-stage FET chip 20 may be decreased in size. Thus, the impedance values of the input port 20a and the output port 20b of the first-stage FET chip 20 may be comparatively increased. That is, the matching circuit for the first-stage FET chip 20 may not be provided if the inductance values of the bonding wires 17a and 17b may be small and the impedance values of the input port 20a and the output port 20b may be comparatively large.

Further, the second-stage FET chip 30 requires a maximum output larger than the first-stage FET chip 20. Thus, the size of the gate electrode (that is, the input port 30a) is larger than that of the first-stage FET chip 20. Therefore, the impedance of the input port 30a extremely decreases (so as to be typically 1 W or less). For this reason, the influence of the inductance of the bonding wire increases even when the second-stage FET chip 30 approaches the second-stage terminal 14. For this reason, it is desirable that the capacitor element 40 for matching the impedance be disposed between the input port 30a and the second-stage terminal 14.

Meanwhile, the impedance of the drain electrode (that is, the output port 30b) of the second-stage FET chip 30 is sufficiently larger than that of the gate electrode (the input port 30a). The reason is as below. In general, the main element or the impedance (the input impedance) of the gate electrode is a Schottky junction capacitance between the gate and the source. Thus, when the frequency of the input signal becomes, for example, a high frequency of a microwave band, the input impedance becomes a small value so as to become, for example, 1 W or less. However, since the main element of the impedance (the output impedance) of the drain electrode is a resistance element of a channel, the output impedance becomes, for example, about several W, and becomes larger than the input impedance. For this reason, in the embodiment, the second-stage FET chip 30 is disposed near the other edge portion 10b. Accordingly, since the bonding wire 17c connecting the output terminals 15 and 16 to the second-stage FET chip 30 is shortened compared to the related art, the inductance of the bonding wire 17c may be decreased. The length of the bonding wire 17c is shorter than that of the bonding wire 17e. Furthermore, since the lengths of the bonding wire 17c and the bonding wire 17e are appropriately selected by the capacitance of the capacitor element 40, the length of the bonding wire 17c does not need to be essentially shorter than that of the bonding wire 17e. That is, the matching circuit for the output port 30b of the second-stage FET chip 30 may not be provided if the inductance value of the bonding wire 17c may be small and the impedance value of the output port 30b may be comparatively large.

As described above, according to the amplifier 1A of the embodiment, there is no need to provide the matching circuit between the input terminal 12 and the first-stage FET chip 20 and the matching circuit between each of the output terminals 15 and 16 and the second-stage FET chip 30. Thus, it is possible to suppress an increase in component cost or an increase in number of mounting steps by decreasing the number of the matching circuits.

Further, as in the embodiment, the impedance of the input terminal 12 may be equal to the impedance of the input port 20a of the first-stage FET chip 20. Accordingly, the matching circuit between the input terminal 12 and the input port 20a may not be provided.

Further, as in the embodiment, the output port of the first-stage FET chip may be a drain, and the input port of the second-stage FET chip may be a gate. Accordingly, the amplifier 1A having the above-described effect may be appropriately configured.

Further, as in the embodiment, the chip size L2 of the second-stage FET chip 30 may be larger than the chip size L1 of the first-stage FET chip 20. Accordingly, the second-stage FET chip 30 may appropriately generate output power larger than the output power from the first-stage FET chip 20.

Further, as in the embodiment, the output terminals 15 and 16 may be connected to the output port 30b of the second-stage FET chip 30. Accordingly, even when the chip size L2 of the second-stage FET chip 30 is large and a plurality of the output port 30b are arranged, a variation in length of the bonding wires 17c respectively connected to the output port 30b may be suppressed.

Furthermore, in the embodiment, a case may be considered in which the output port 20b of the first-stage FET chip 20 and the electrode 40a of the capacitor element 40 are connected inside the package 10 without using the first-stage terminal 13 and the second-stage terminal 14. However, in such an embodiment, there is a need to integrate the matching circuit 62 (see FIG. 5), the drain bias circuit 66 of the first-stage FET chip 20, the gate bias circuit 65 of the second-stage FET chip 30, and a DC block inside the package 10. Further, there is a need to additionally provide at least two voltage input terminals for the drain bias circuit 66 of the first-stage FET chip 20 and the gate bias circuit 65 of the second-stage FET chip 30. Thus, in such an embodiment, the component cost or the number of mounting steps increases compared to the above-described embodiment. Specifically, a fine mounting technique is needed in order to mount components inside the package 10, this technique leads to an increase in manufacturing cost. If there is not a large influence on the high-frequency signal, in many cases, the manufacturing cost may be decreased when a person that uses the amplifier 1A attaches the matching circuit 62, the drain bias circuit 66, the gate bias circuit 65, and the DC block to the outside. Since other components need to be essentially mounted on the interconnection substrate 50 when the amplifier 1A is used, the number of mounting steps does not largely change even when the external attachment components are added. Further, since the matching circuit 62, the drain bias circuit 66, the gate bias circuit 65, and the DC block are attached to the outside, the characteristics may be easily adjusted by the replacement of the component. According to the embodiment, since the output port 20b of the first-stage FET chip 20 and the electrode 40a of the capacitor element 40 are connected at the outside of the package 10 through the first-stage terminal 13 and the second-stage terminal 14, an increase in component cost or an increase in number of mounting steps may be further effectively suppressed.

Figure 6:
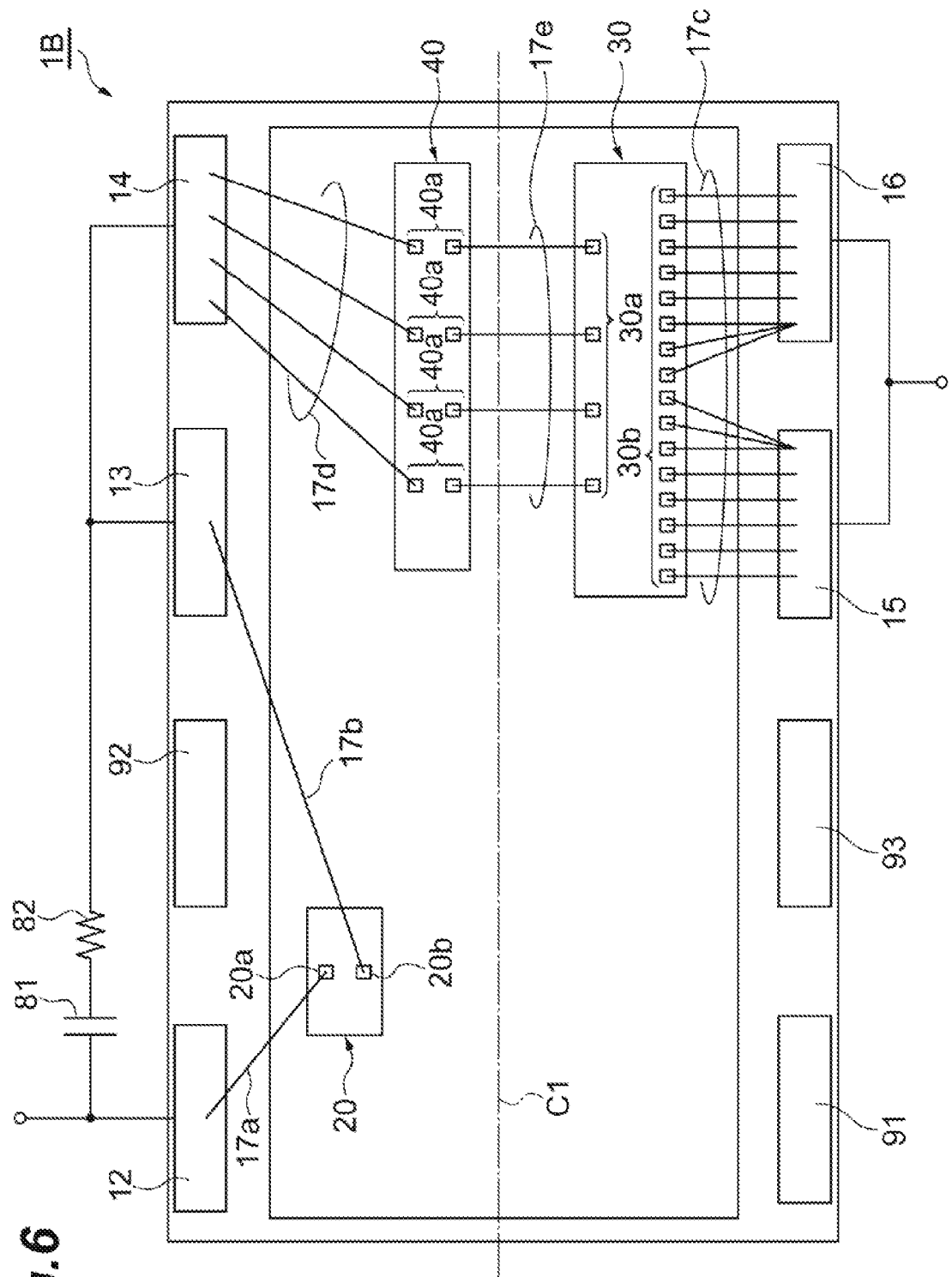
FIG. 6 is a top view illustrating the configuration of an amplifier according to a first modified example.

FIG. 6 is a top view illustrating the configuration of an amplifier 1B according to a first modified example of the above-described embodiment. The amplifier 1B of the modified example is different from the amplifier 1A of the above-described embodiment in that the number and the arrangement of the terminals are different. That is, in the modified example, a package including eight terminals is used, and two terminals 92 and 93 are further provided in addition to the configuration of the above-described embodiment. The terminals 92 and 93 are all unused terminals. The terminal 92 (the third terminal) is provided in one edge portion 10a, and the terminal 93 is provided in the other edge portion 10b. The terminal 92 is disposed between the input terminal 12 and the first-stage terminal 13. The terminal 93 is disposed between the terminal 91 and the output terminals 15 and 16.

In the above-described embodiment, the input terminal 12 which is connected to the input port 20a of the first-stage FET chip 20 and the first-stage terminal 13 which is connected to the output port 20b of the first-stage FET chip 20 are all disposed near the edge portion 10a. Thus, there is a case in which the isolation degree between the input and the output of the first-stage FET chip 20 may be degraded. On the contrary, as in the modified example, the isolation degree may be improved in a manner such that the terminal 92 as the unused terminal is disposed between the input terminal 12 and the first-stage terminal 13 and is grounded. Furthermore, the unused terminal may not be grounded.

Furthermore, as illustrated in FIG. 6, the input terminal 12 and the first-stage terminal 13 may be connected to each other through a capacitor 81 and a resistance 82 which are connected in series to each other.

Figure 7:
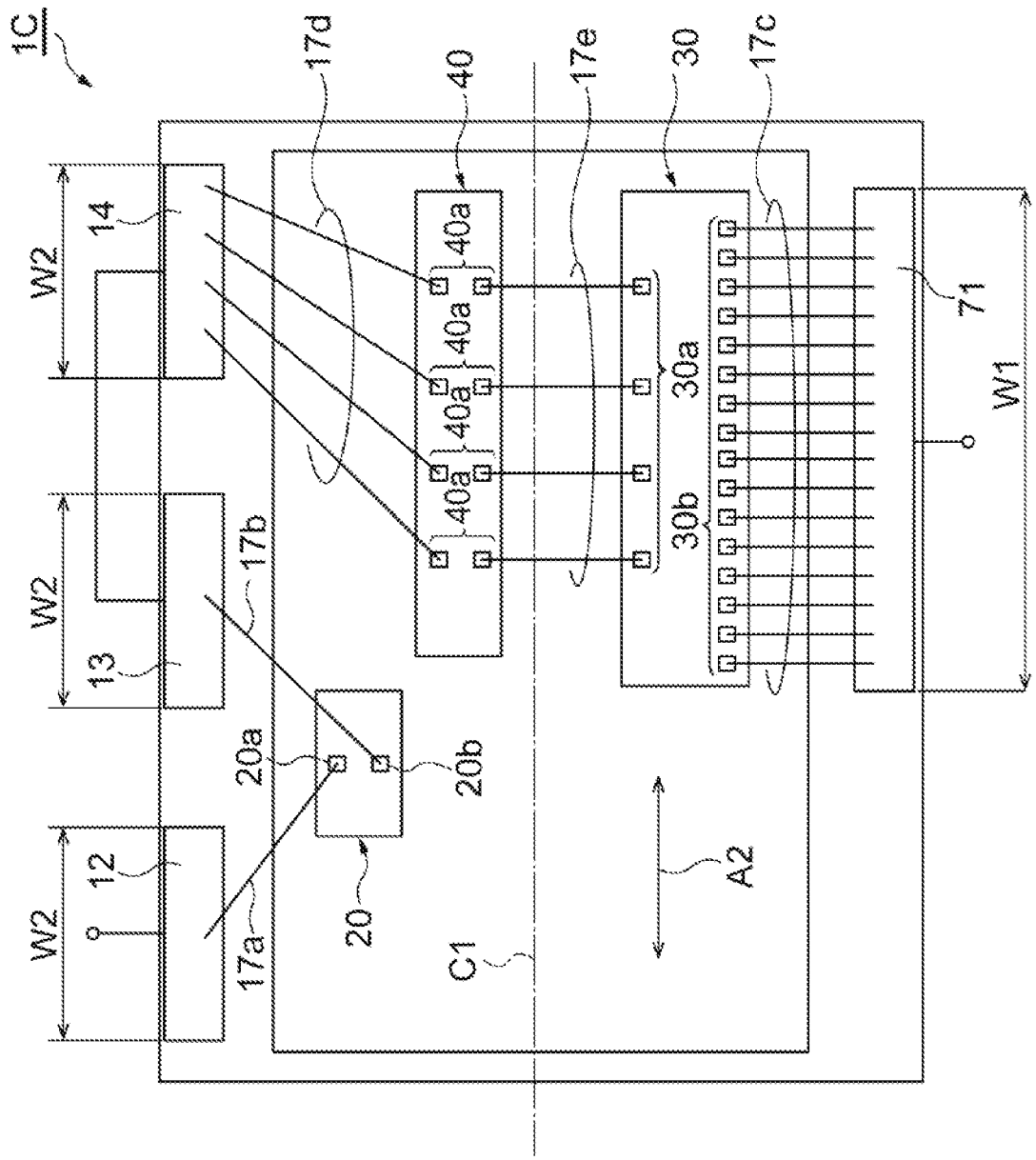
FIG. 7 is a top view illustrating the configuration of an amplifier according to a second modified example.

FIG. 7 is a top view illustrating the configuration of an amplifier 1C according to a second modified example of the above-described embodiment. The amplifier 1C of the modified example is different from the amplifier 1A of the above-described embodiment in that the number and the shape of the terminals are different. That is, in the modified example, one output terminal 71 is provided instead of the output terminals 15 and 16 of the above-described embodiment. Further, the terminal 91 (see FIG. 1) as the unused terminal is not provided.

In the modified example, the width W1 of the output terminal 71 in the direction (the second direction A2) following the pair of edge portions 10a and 10b is larger than the width W2 of each of different terminals (the input terminal 12, the first-stage terminal 13, and the second-stage terminal 14) in the same direction. Such a terminal may be implemented by designing a dedicated package instead of a versatile package.

In general, the output power from the second-stage FET chip 30 is remarkably larger than the input power and the output power of the first-stage FET chip 20. Thus, when the width of the output terminal 71 is larger than the width of each of different terminals 12 to 14 as in the modified example, the resistance value of the output terminal 71 decreases, and hence large power may be output with high efficiency.

The amplifier according to the invention is not limited to the above-described embodiment, and may be modified into various forms. For example, in the above-described embodiment, a package which is molded by a resin material is exemplified, but the type of package is not limited thereto. For example, a hermetic seal type may be employed. Further, in the above-described embodiment, GaN and GaAs are exemplified as the semiconductor materials of the first-stage FET chip and the second-stage FET chip, but the invention is not limited to the semiconductor materials.

What is claimed is:

1. An amplifier comprising:
    a package which includes a first edge and a second edge, the first edge and the second edge are arranged in parallel to both sides of the package;
    an input terminal which is provided in the first edge;
    an output terminal which is provided in the second edge;
    a first-stage amplifier chip which is provided in the package and includes an input port connected to the input terminal by a first bonding wire;
    a first-stage terminal which is provided in the first edge and is connected to an output port of the first-stage amplifier chip by a second bonding wire;
    a second-stage terminal which is provided in the first edge;
    a second-stage amplifier chip which is provided in the package, includes an output port connected to the output terminal by a third bonding wire; and
    an capacitor element which is provided in the package and of which one electrode is connected to the second-stage terminal through a fourth bonding wire and is connected to an input port of the second-stage amplifier chip through a fifth bonding wire,
    wherein the distance between the first edge and the first-stage amplifier chip is shorter than the distance between the second edge and the first-stage amplifier chip, and
    wherein the distance between the second edge and the second-stage amplifier chip is shorter than the distance between the first edge and the second-stage amplifier chip.

2. The amplifier of claim 1,
    wherein the sum of the length of the fourth bonding wire and the length of the fifth bonding wire is longer than the length of the third bonding wire.

3. The amplifier of claim 1,
    wherein the impedance of the input port of the first-stage amplifier chip is larger than the impedance of the input port of the second-stage amplifier chip, and the impedance of the output port of the first-stage amplifier chip is larger than the impedance of the output port of the second-stage amplifier chip.

4. The amplifier of claims 1,
    wherein the width of the output terminal is larger than the width of each of the input terminal, the first-stage terminal, and the second-stage terminal.

5. The amplifier of claims 1,
    further comprising a third terminal which is provided in the first edge and is located between the input terminal and the first-stage terminal,
    wherein the third terminal connected to a ground potential.

6. The amplifier of claims 1,
    wherein the first-stage terminal and the second-stage terminal are connected to each other at the outside of the package.

7. The amplifier of claims 1,
wherein the chip size of the second-stage FET chip is larger than that of the first-stage FET chip.

8. The amplifier of claim 1,
wherein the package is sealed by a resin.

9. The amplifier of claim 1,
wherein a matching circuit is not provided between the input terminal and the first-stage FET chip and between the output terminal and the second-stage FET chip.

10. The amplifier of claim 1,
wherein in the output power of the second-stage amplifier chip is larger than output power of the first-stage amplifier chip.

11. The amplifier of claim 10,
wherein a driving voltage of the first-stage amplifier chip is equal to a driving voltage of the second-stage amplifier chip.

12. The amplifier of claim 1,
wherein the first-stage amplifier chip and the second-stage amplifier chip are formed as discrete chips.

13. The amplifier of claim 1,
wherein the first-stage amplifier chip and the second-stage amplifier chip are composed of gallium nitride based material.

* * * * *